United States Patent
Hou et al.

(10) Patent No.: US 7,812,432 B2
(45) Date of Patent: Oct. 12, 2010

(54) CHIP PACKAGE WITH A DAM STRUCTURE ON A DIE PAD

(75) Inventors: Po-Kai Hou, Tainan County (TW); Chi-Jin Shih, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 52 days.

(21) Appl. No.: 12/268,591

(22) Filed: Nov. 11, 2008

(65) Prior Publication Data

US 2009/0224384 A1 Sep. 10, 2009

(30) Foreign Application Priority Data

Mar. 7, 2008 (TW) .............................. 97108075 A

(51) Int. Cl.
*H01L 23/495* (2006.01)
*H01L 21/00* (2006.01)
*H01R 9/00* (2006.01)

(52) U.S. Cl. ................. 257/676; 257/783; 257/787; 257/E23.01; 257/E23.014; 257/E23.031; 257/E23.37; 257/E23.043; 257/E23.141; 361/772; 361/813; 438/123; 438/127

(58) Field of Classification Search ................. None
See application file for complete search history.

(56) References Cited

U.S. PATENT DOCUMENTS 5,278,446 A * 1/1994 Nagaraj et al. ............. 257/707

| | | | |
|---|---|---|---|
| 6,585,905 B1 * | 7/2003 | Fan et al. | 216/14 |
| 6,661,083 B2 * | 12/2003 | Lee et al. | 257/676 |
| 6,713,849 B2 * | 3/2004 | Hasebe et al. | 257/667 |
| 7,145,222 B2 * | 12/2006 | Gai | 257/667 |
| 7,224,070 B2 * | 5/2007 | Yang | 257/777 |
| 7,262,491 B2 * | 8/2007 | Islam et al. | 257/670 |
| 7,411,289 B1 * | 8/2008 | McLellan et al. | 257/700 |
| 7,446,397 B2 * | 11/2008 | Gai | 257/667 |
| 2002/0163015 A1 * | 11/2002 | Lee et al. | 257/200 |
| 2006/0035414 A1 * | 2/2006 | Park et al. | 438/124 |

FOREIGN PATENT DOCUMENTS

| | | | |
|---|---|---|---|
| CN | 1753174 | | 3/2006 |
| CN | 101106093 | | 1/2008 |
| JP | 02130864 A | * | 5/1990 |
| JP | 04168759 A | * | 6/1992 |
| JP | 06021317 A | * | 1/1994 |
| WO | WO 2007030345 | | 3/2007 |

* cited by examiner

*Primary Examiner*—Alonzo Chambliss
(74) *Attorney, Agent, or Firm*—J.C. Patents

(57) ABSTRACT

A chip package including a die pad, a plurality of leads, a chip, an adhesive, and a molding compound is provided. The die pad has a top surface and a bottom surface opposite to the top surface, wherein the die pad has a blocking portion disposed on the top surface, and the leads are disposed around the die pad. The chip is disposed on the top surface of the die pad surrounded by the blocking portion and is electrically connected to the leads. A top surface of the blocking portion is higher than the top surface of the die pad surrounded by the blocking portion. The adhesive is disposed between the chip and the die pad. The molding compound encapsulates the chip, a portion of the leads, and the die pad.

13 Claims, 6 Drawing Sheets

CHIP PACKAGE WITH A DAM STRUCTURE ON A DIE PAD

CROSS-REFERENCE TO RELATED APPLICATION

This application claims the priority benefit of Taiwan application serial no. 97108075, filed on Mar. 7, 2008. The entirety of the above-mentioned patent application is hereby incorporated by reference herein and made a part of specification.

BACKGROUND OF THE INVENTION

1. Field of the Invention

The present invention generally relates to a chip package, and more particularly, to a chip package having excellent reliability.

2. Description of Related Art

In the semiconductor industry, the fabrication of integrated circuits (IC) can be divided into three phases: IC design, IC fabrication process, and IC packaging.

Regarding IC packaging, a chip is fabricated through wafer fabrication, circuit design, photolithography and etching processes, and wafer dicing, etc. Each chip is electrically connected to a substrate through a bonding pad on the chip, and the chip is encapsulated by a molding compound to form a chip package structure. The packaging process protects the chip from heat, humidity, and contamination and provides an electrical connection medium between the chip and external circuits.

FIG. 1 is a cross-sectional diagram of a conventional chip package. Referring to FIG. 1, the conventional chip package 100 includes a chip 110, a lead frame 120, a conductive paste 130, and a molding compound 140. The lead frame 120 has a die pad 122 and a plurality of leads 124. The chip 110 is disposed on the die pad 122 through the conductive paste 130 and is electrically connected to the leads 124 through a plurality of wires 152. The molding compound 140 encapsulates the chip 110, the wires 152, the die pad 122, and a portion of each of the leads 124. In addition, the conventional chip package 100 further includes a plurality of grounding wires 154 which are electrically connected to the chip 110 and the die pad 122.

However, the conductive paste in the conventional chip package may overflow and cause the chip package to have abnormal electrical connection and deteriorated reliability. Generally speaking, the conductive paste 130 may overflow and accordingly contact the grounding wires 154 (as shown in FIG. 1) on the die pad during a die bonding process. Besides, the conductive paste may be overheated by the pressure during the process so that the conductive particles in the conductive paste contact the grounding wires and accordingly electrically connect the conductive paste and the grounding wires.

As described above, the reliability of the conventional chip package 100 is required to be further enhanced.

SUMMARY OF THE INVENTION

Accordingly, the present invention is directed to a chip package, wherein abnormal electrical connection caused by the overflowed adhesive is avoided and accordingly the reliability of the chip package can be enhanced.

The present invention provides a chip package including a die pad, a plurality of leads, a chip, an adhesive, and a molding compound. The die pad has a top surface and a bottom surface opposite to the top surface, wherein the die pad has a blocking portion disposed on the top surface, and the leads are disposed around the die pad. The chip is disposed on the top surface of the die pad surrounded by the blocking portion and is electrically connected to the leads. A top surface of the blocking portion is higher than the top surface of the die pad surrounded by the blocking portion. The adhesive is disposed between the chip and the die pad. The molding compound encapsulates the chip, a portion of the leads, and the die pad.

According to an embodiment of the present invention, the blocking portion may be an annular blocking portion, a plurality of sub-blocking portions, or a plurality of strip-shaped sub-blocking portions and a plurality of L-shaped sub-blocking portions disposed distributedly.

According to an embodiment of the present invention, the die pad further includes a groove located on the top surface of the die pad.

According to an embodiment of the present invention, the bottom surface of the die pad has a first opening, and/or one end of at least one of the leads adjacent to the die pad has a second opening.

According to an embodiment of the present invention, the chip package further includes a plurality of first wires connecting the chip and one ends of the leads, and the chip package may further include a plurality of second wires connecting the chip and the die pad.

According to an embodiment of the present invention, the adhesive is a conductive paste, wherein the conductive paste may be silver paste.

According to an embodiment of the present invention, the material of the molding compound is polymer.

According to an embodiment of the present invention, the blocking portion is formed integrally with the die pad through an etching process, and the material thereof is the same as the material of the die pad. In addition, the blocking portion may be formed through an electroplating process, and the material thereof may be metal. The blocking portion may also be formed through dispensing, and the material thereof may be polymer.

In the present invention, the die pad has a blocking portion disposed on the top surface thereof so as to prevent the adhesive from contacting the grounding wires due to the overflowed adhesive. Accordingly, abnormal electrical connection can be effectively prevented, so that the reliability of a chip package can be enhanced. Moreover, in the present invention, the die pad may further have a groove to prevent abnormal electrical connection caused by overflow of the adhesive. Furthermore, openings may be formed on the bottom surface of the die pad and/or at one end of at least one lead adjacent to the die pad in order to increase the contact area between the die pad and the molding compound so that the leads would not peel off or delaminate from the die pad.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
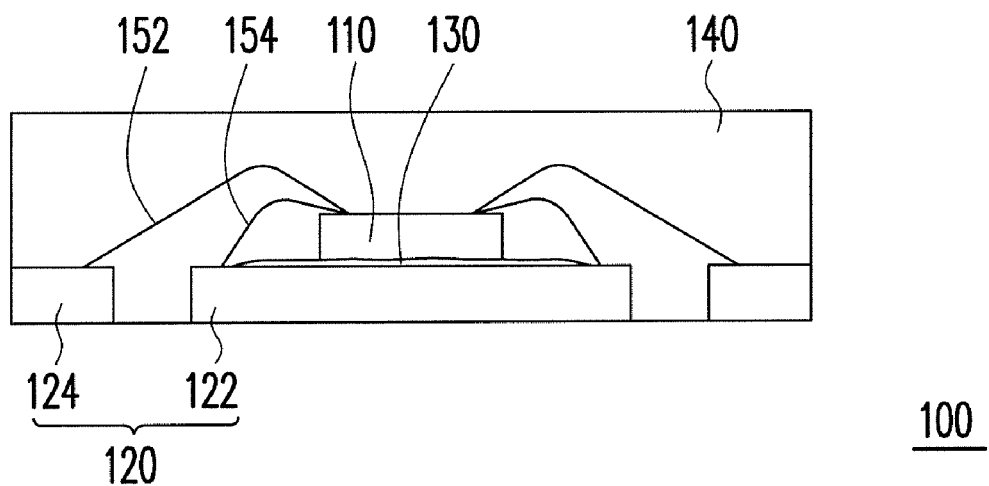
FIG. 1 is a cross-sectional diagram of a conventional chip package.

Reference will now be made in detail to the present preferred embodiments of the invention, examples of which are illustrated in the accompanying drawings. Wherever possible, the same reference numbers are used in the drawings and the description to refer to the same or like parts.

Several embodiments of the chip package structure provided by the present invention will be described below. However, these embodiments are not intended to limiting the scope of the present invention.

Figure 2:
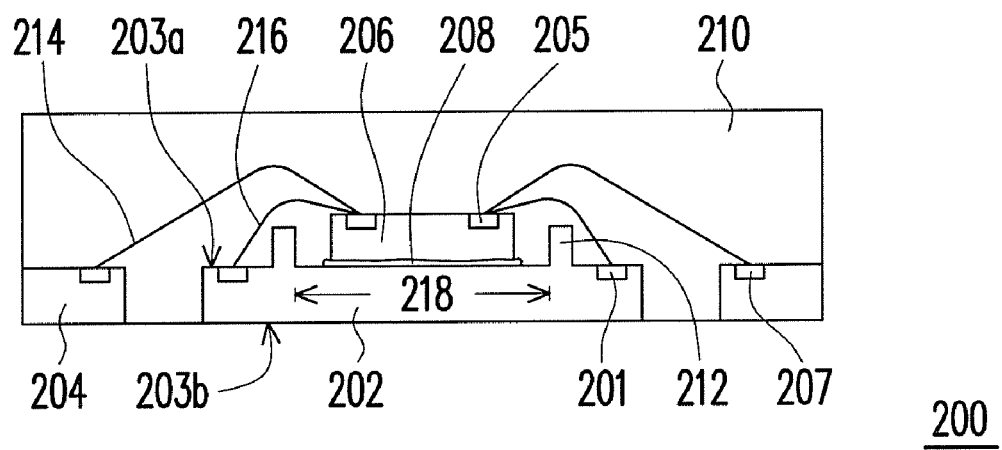
FIG. 2 is a cross-sectional diagram of a chip package according to an embodiment of the present invention.

FIG. 2 is a cross-sectional diagram of a chip package according to an embodiment of the present invention.

As shown in FIG. 2, in the present embodiment, the chip package 200 includes a die pad 202, a plurality of leads 204, a chip 206, an adhesive 208, and a molding compound 210. The die pad 202 has a top surface 203a for supporting the chip and a bottom surface 203b opposite to the top surface 230a, and the leads 204 are disposed around the die pad 202. The chip 206 is disposed on the die pad 202 through the adhesive 208, wherein the adhesive 208 may be silver paste or other suitable conductive paste.

The bonding pads 205 on the chip 206 are connected to the contacts 207 of the leads 204 through a plurality of wires 214 so that the chip 206 can be electrically connected to one of the leads 204 through wire bonding (W/B) process. The wires 214 may be gold wires or wires made of other suitable conductive materials. In addition, a plurality of wires 216 is further disposed as grounding wires for electrically connecting the bonding pads 205 of the chip 206 and the contacts 201 of the die pad 202.

In addition, the chip package 200 in the present embodiment further includes a blocking portion 212. The blocking portion 212 is disposed on the top surface 203a of the die pad 202 and is disposed around the chip 206. Particularly, a top surface of the blocking portion 212 is higher than the top surface 203a it surrounds (i.e., the top surface 203a within the area 218), and such a design prevents the overflowed adhesive 208 from contacting the grounding wires. Accordingly, abnormal electrical connection is prevented, so that the reliability of the chip package can be enhanced.

Figure 3:
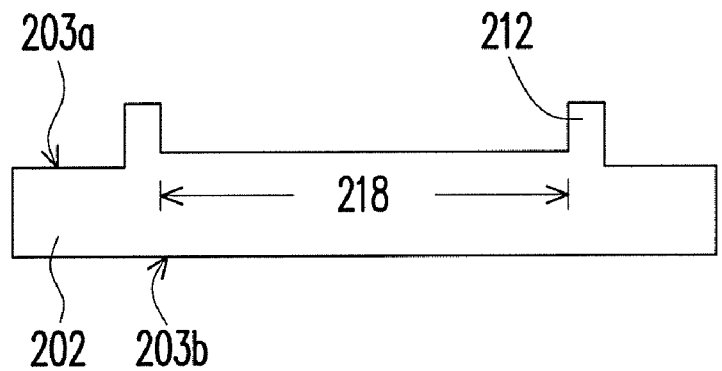
FIG. 3 and FIG. 4 are diagrams illustrating the dispositions of a die pad and a blocking portion in the present invention.
Figure 4:
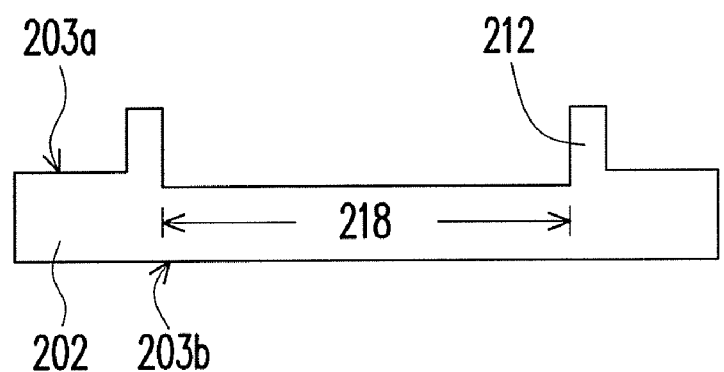

In the present embodiment, the top surface of the blocking portion 212 is higher than the top surface 203a within the area 218, and the top surfaces at both sides of the blocking portion 212 have the same height. However, in another embodiment of the present invention, the top surfaces at both sides of the blocking portion 212 may have different heights. FIG. 3 and FIG. 4 are diagrams illustrating the dispositions of a die pad and a blocking portion in the present invention. As shown in FIG. 3, the top surface of the blocking portion 212 is higher than the top surface 203a within the area 218, and the top surface 203a within the area 218 is higher than the top surface at the other side of the blocking portion 212. As shown in FIG. 4, the top surface of the blocking portion 212 is higher than the top surface 203a within the area 218, and the top surface 203a within the area 218 is lower than the top surface at the other side of the blocking portion 212.

As described above, the blocking portion 212 may be made of substantially the same material as the die pad 202, and which may be formed integrally with the die pad 202 through an etching process. The blocking portion 212 may be made of metal through an electroplating process. The blocking portion 212 may also be made of polymer through dispensing.

Additionally, in the present embodiment, the molding compound 210 of the chip package 200 encapsulates the chip 206, a portion of the leads 204, the die pad 202, the adhesive 208, and the wires 214 and 216. The molding compound 210 is made of epoxy resin or other suitable polymers.

Figure 5A:
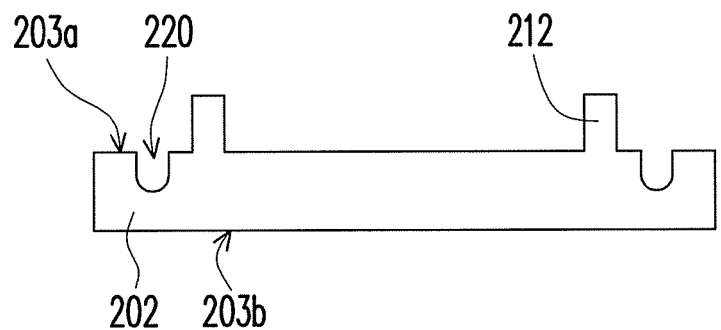
FIGS. 5A~5C are diagrams of a die pad having a groove and a blocking portion.
Figure 5B:
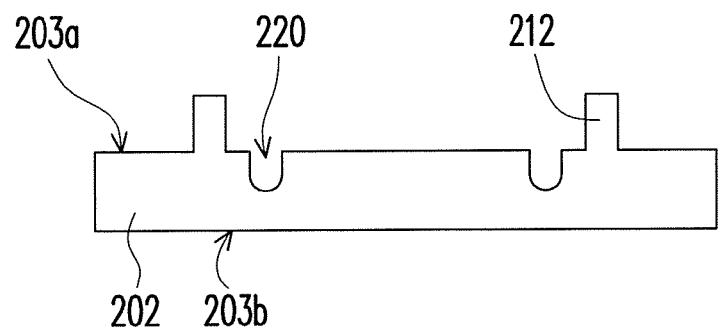
Figure 5C:
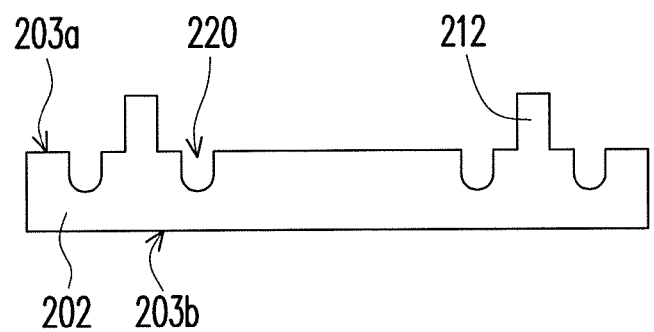

In another embodiment of the present invention, besides the blocking portion 212 disposed on the die pad 202, a groove may be further formed on the top surface 203a of the die pad 202 in order to prevent abnormal electrical connection caused by overflow of the adhesive 208. For the convenience of description, a die pad having only a groove and a blocking portion is illustrated in FIGS. 5A~5C, wherein the other elements are omitted and are described by referring to the elements of the die pad 202 illustrated in FIG. 2. As shown in FIG. 5A, there is at least one groove 220 on the top surface 203a of the die pad 202, and the groove 220 is located at the outside of the blocking portion 212. As shown in FIG. 5B, the groove 220 may also be located within the area surrounded by the blocking portion 212. As shown in FIG. 5C, the grooves 220 may be disposed at the outside of the blocking portion 212 and within the area surrounded by the blocking portion 212. However, the size, number, and shape of the groove(s) are not limited herein, and any slight variation is considered within the scope of the present invention.

Figure 6A:
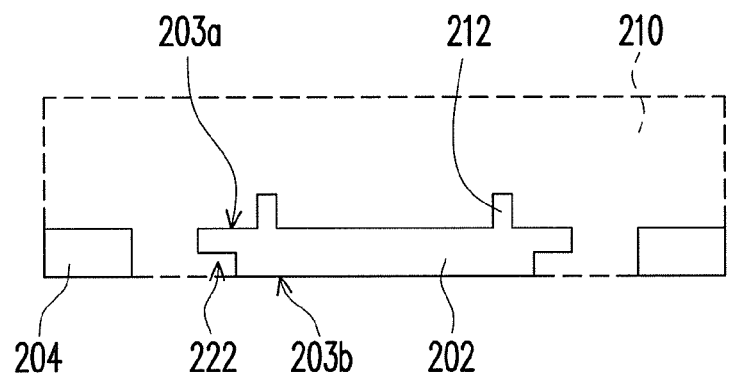
FIGS. 6A~6C are cross-sectional diagrams of a die pad and a plurality of leads according to an embodiment of the present invention.
Figure 6B:
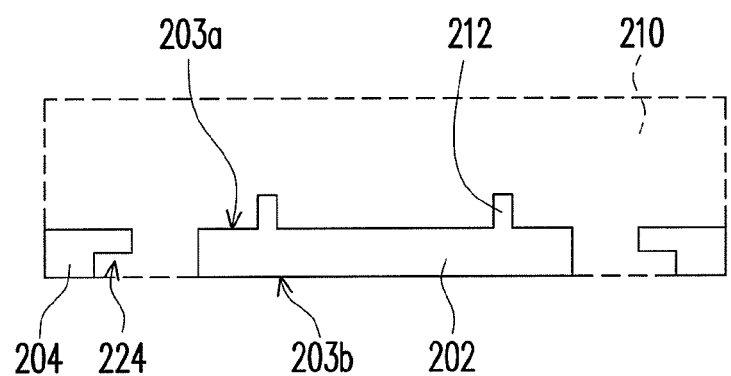
Figure 6C:
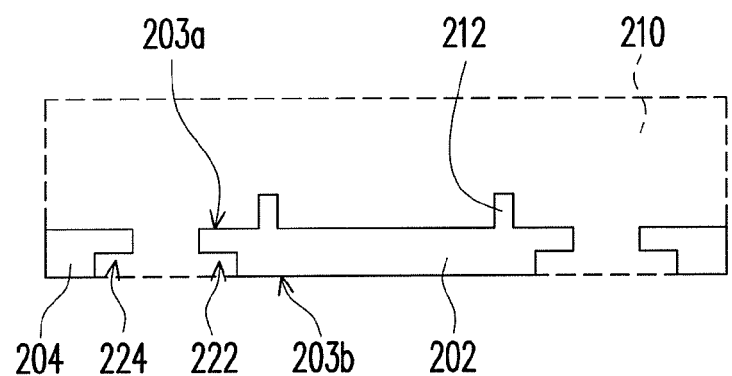

FIGS. 6A~6C are cross-sectional diagrams of a die pad and a plurality of leads according to yet another embodiment of the present invention. Similarly, for the convenience of description, only a die pad having a blocking portion, a lead, and a molding compound are illustrated, and the other elements are omitted and described by referring to the elements of the die pad 202 in FIG. 2. As shown in FIG. 6A, the bottom surface 203b of the die pad 202 has an opening 222 which helps to increase the contact area between the die pad 202 and the molding compound so that the die pad would not peel off or delaminate. As shown in FIG. 6B, one end of at least one lead 204 adjacent to the die pad 202 has an opening 224 which helps to increase the contact area between the die pad 202 and the molding compound so that the leads would not peel off or delaminate. As shown in FIG. 6C, there are openings 222 and 224 on both the bottom surface 203b of the die pad 202 and one end of at least one lead 204 adjacent to the die pad 202. However, in the embodiment illustrated in FIGS. 6A~6C, the die pad may also have a groove (now shown) as described in forgoing embodiments, and which can be implemented according to foregoing embodiment by one ordinary skilled in the art therefore will not be described herein.

Next, the blocking portion in the present invention will be described in detail according to several embodiments of the present invention with reference to accompanying drawings so that one ordinary skilled in the art can implement the present invention accordingly.

Figure 7A:
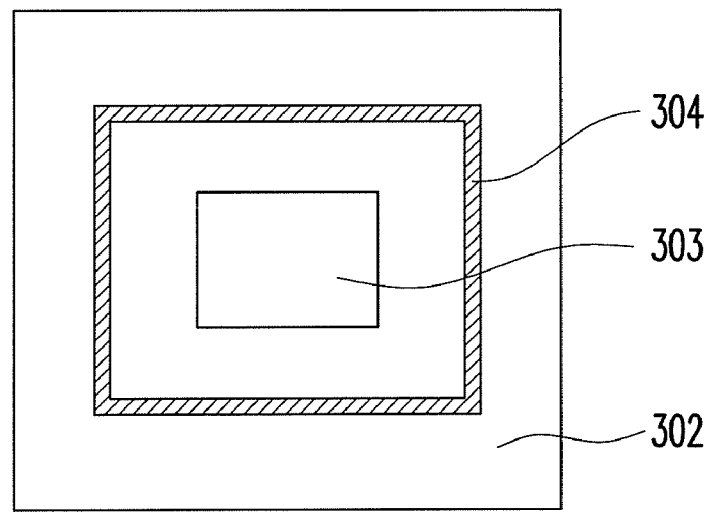
FIGS. 7A~7C are respectively top views of a blocking portion according to a first, a second, and a third embodiment of the present invention.
Figure 7B:
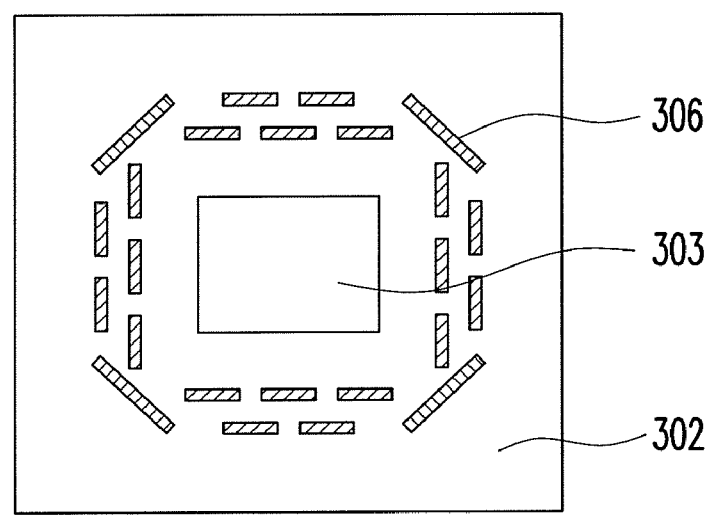
Figure 7C:
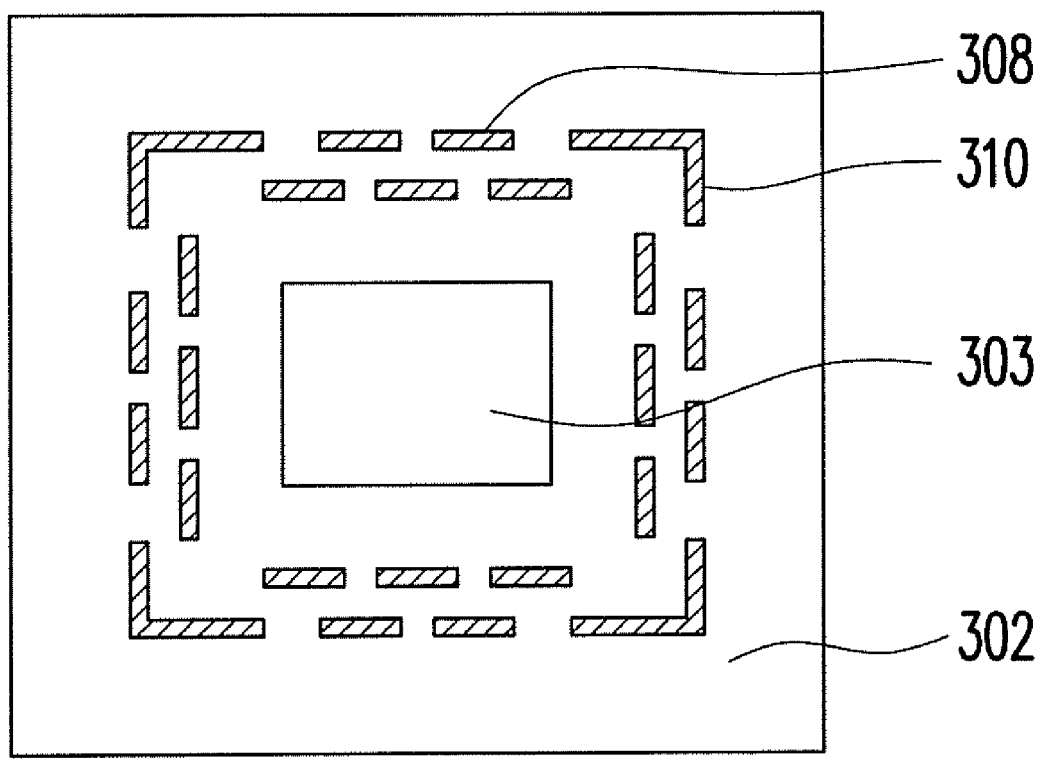

FIGS. 7A~7C are respectively a top view of a blocking portion according to a first, a second, and a third embodiment of the present invention, wherein only a chip, a die pad, and the blocking portion are illustrated for the convenience of description.

As shown in FIG. 7A, an annular blocking portion is disposed on the die pad 302. The annular blocking portion can restrict the overflow of the adhesive within the area surrounded by the blocking portion so that the overflowed adhesive will not contact the grounding wires. The annular blocking portion is disposed around the chip 303, and which may be a rectangular annular blocking portion 304. However, the shape of the annular blocking portion is not limited in the present invention, and the annular blocking portion may also have a circular shape or a polygonal shape, etc.

As shown in FIG. 7B, the blocking portion may be composed of a plurality of sub-blocking portions, wherein the sub-blocking portions may be linear blocking portions 306. By arranging the linear blocking portions 306 appropriately, the overflowing path of the adhesive can be extended and accordingly the overflowed adhesive can be prevented from contacting the grounding wires. As shown in FIG. 7C, the blocking portion may be composed of a plurality of strip-shaped sub-blocking portions 308 and a plurality of L-shaped sub-blocking portions 310 disposed distributedly. However, the arrangement, size, number, and shape of the blocking portion are not restricted in the present invention, and any slight variation is considered within the scope of the present invention.

In overview, in the present invention, a blocking portion is disposed on a die pad to prevent the overflowed adhesive from contacting the grounding wires and accordingly to prevent abnormal electrical connection, so that the reliability of the chip package is enhanced. Moreover, a groove may be further formed on the die pad besides the blocking portion in order to further prevent abnormal electrical connection caused by the overflow of the adhesive. Furthermore, openings are formed on the bottom surface of the die pad and/or at one end of at least one lead adjacent to the die pad to increase the contact area between the die pad and the molding compound so that the leads would not peel off or delaminate from the die pad.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
    a die pad having a top surface and a bottom surface opposite to the top surface, wherein the die pad has a blocking portion disposed on the top surface, and the blocking portion comprises a plurality of sub-blocking portions;
    a plurality of leads disposed around the die pad;
    a chip disposed on the top surface of the die pad surrounded by the blocking portion, wherein the chip is electrically connected to the leads, a top surface of the blocking portion is higher than the top surface of the die pad surrounded by the blocking portion;
    an adhesive disposed between the chip and the die pad; and
    a molding compound encapsulating the chip, a portion of the leads, and the die pad.

2. The chip package according to claim 1, wherein the blocking portion comprises an annular blocking portion.

3. The chip package according to claim 1, wherein the blocking portion comprises a plurality of strip-shaped sub-blocking portions and a plurality of L-shaped sub-blocking portions disposed distributedly.

4. The chip package according to claim 1, wherein the die pad further comprises a groove located on the top surface of the die pad.

5. The chip package according to claim 1, wherein the bottom surface of the die pad has a first opening and/or one end of at least one of the leads adjacent to the die pad has a second opening.

6. The chip package according to claim 1, further comprising a plurality of first wires connecting the chip and one ends of the leads.

7. The chip package according to claim 6, further comprising a plurality of second wires connecting the chip and the die pad.

8. The chip package according to claim 1, wherein the adhesive is a conductive paste.

9. The chip package according to claim 8, wherein the conductive paste comprises silver paste.

10. The chip package according to claim 1, wherein a material of the molding compound is polymer.

11. The chip package according to claim 1, wherein the blocking portion is formed integrally with the die pad through an etching process, and a material of the blocking portion is the same as a material of the die pad.

12. The chip package according to claim 1, wherein the blocking portion is formed through an electroplating process and a material of the blocking portion is metal.

13. The chip package according to claim 1, wherein the blocking portion is formed through dispensing and a material of the blocking portion is polymer.

* * * * *